United States Patent
Hung et al.

(10) Patent No.: US 8,823,003 B2
(45) Date of Patent: Sep. 2, 2014

(54) GATE INSULATOR LOSS FREE ETCH-STOP OXIDE THIN FILM TRANSISTOR

(71) Applicant: Apple Inc., Cupertino, CA (US)

(72) Inventors: Ming-Chin Hung, Cupertino, CA (US); Kyung Wook Kim, Cupertino, CA (US); Young Bae Park, Cupertino, CA (US); Hao-Lin Chiu, Taipei (TW); Chun-Yao Huang, Cupertino, CA (US); Shih Chang Chang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/629,537

(22) Filed: Sep. 27, 2012

(65) Prior Publication Data

US 2014/0042427 A1    Feb. 13, 2014

Related U.S. Application Data

(60) Provisional application No. 61/682,161, filed on Aug. 10, 2012.

(51) Int. Cl.
*H01L 29/10*  (2006.01)
*H01L 29/786* (2006.01)

(52) U.S. Cl.
CPC .................................. *H01L 29/786* (2013.01)
USPC ........................................................ 257/59

(58) Field of Classification Search
CPC ................................................. H01L 29/786
USPC ............................ 257/43, 57, 59, 88, E29.296
See application file for complete search history.

(56) References Cited

U.S. PATENT DOCUMENTS

| | | | |
|---|---|---|---|
| 4,958,205 A * | 9/1990 | Takeda et al. | 257/387 |
| 5,075,237 A * | 12/1991 | Wu | 438/73 |
| 5,990,492 A * | 11/1999 | Kim | 257/59 |
| 6,037,017 A | 3/2000 | Kashiro | |
| 6,372,636 B1 | 4/2002 | Chooi et al. | |
| 6,500,701 B2 | 12/2002 | Higashi et al. | |
| 6,882,398 B2 | 4/2005 | Watanabe et al. | |
| 6,970,219 B1 | 11/2005 | Hermann | |
| 7,221,012 B2 | 5/2007 | Chu et al. | |
| 7,465,678 B2 | 12/2008 | Bhattacharya | |

(Continued)

FOREIGN PATENT DOCUMENTS

| | | |
|---|---|---|
| EP | 1801647 | 6/2007 |
| EP | 2341759 | 7/2011 |

(Continued)

*Primary Examiner* — Nikolay Yushin
(74) *Attorney, Agent, or Firm* — Brownstein Hyatt Farber Schreck, LLP

(57) ABSTRACT

A method is provided for fabricating a thin-film transistor (TFT). The method includes forming a semiconductor layer over a gate insulator that covers a gate electrode, and depositing an insulator layer over the semiconductor layer, as well as etching the insulator layer to form a patterned etch-stop without losing the gate insulator. The method also includes forming a source electrode and a drain electrode over the semiconductor layer and the patterned etch-stop. The method further includes removing a portion of the semiconductor layer beyond the source electrode and the drain electrode such that a remaining portion of the semiconductor layer covers the gate insulator in a first overlapping area of the source electrode and the gate electrode and a second overlapping area of the drain electrode and gate electrode.

11 Claims, 14 Drawing Sheets

(56) References Cited

U.S. PATENT DOCUMENTS

| | | | |
|---|---|---|---|
| 7,476,896 B2 | 1/2009 | Choi et al. | |
| 7,495,736 B2 | 2/2009 | Chen et al. | |
| 7,767,502 B2 | 8/2010 | Kim et al. | |
| 7,843,041 B2 | 11/2010 | Kodaira et al. | |
| 8,003,986 B2 | 8/2011 | Teng et al. | |
| 8,039,838 B2 | 10/2011 | Heitzinger et al. | |
| 8,113,902 B2 | 2/2012 | Kang et al. | |
| 8,203,261 B2 | 6/2012 | Tanaka et al. | |
| 8,373,181 B2 | 2/2013 | Aurongzeb et al. | |
| 2004/0063001 A1 | 4/2004 | Wu et al. | |
| 2006/0043318 A1 | 3/2006 | Kodera | |
| 2011/0006301 A1* | 1/2011 | Yamazaki et al. | 257/43 |
| 2011/0227064 A1 | 9/2011 | Park et al. | |
| 2011/0250435 A1 | 10/2011 | Ge et al. | |
| 2012/0056173 A1* | 3/2012 | Pieralisi | 257/43 |
| 2012/0248451 A1 | 10/2012 | Sone et al. | |
| 2013/0020731 A1 | 1/2013 | Kim et al. | |
| 2013/0069061 A1 | 3/2013 | Nakazawa | |
| 2013/0161622 A1* | 6/2013 | Lee | 257/57 |
| 2013/0233482 A1 | 9/2013 | Chen et al. | |

FOREIGN PATENT DOCUMENTS

| | | |
|---|---|---|
| JP | 2003-057661 | 2/2003 |
| KR | 100961268 | 6/2010 |
| WO | WO 2011/071198 | 6/2011 |
| WO | WO 2011/151970 | 12/2011 |

\* cited by examiner

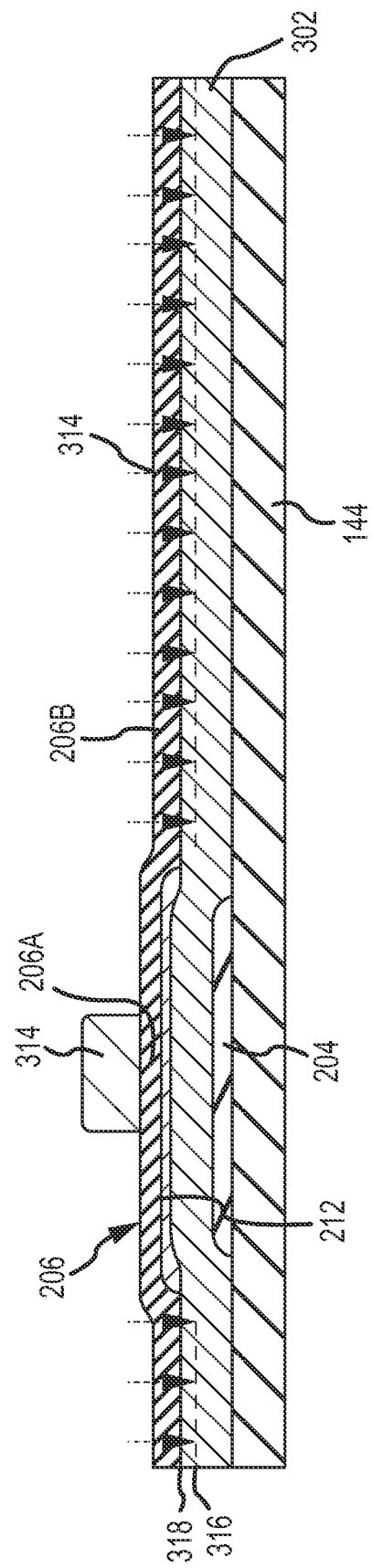

GATE INSULATOR LOSS FREE ETCH-STOP OXIDE THIN FILM TRANSISTOR

CROSS-REFERENCE TO RELATED APPLICATION

The present application claims priority to U.S. Provisional Application No. 61/682,161, entitled "Gate Insulator Loss Free Etch-Stop Oxide Thin Film Transistor", filed Aug. 10, 2012, the disclosure of which is incorporated herein by reference in its entirety.

TECHNICAL FIELD

The present invention generally relates to oxide thin film transistor (TFT) for a liquid crystal display. More specifically, the invention relates to an TFT with a semiconductor indium-gallium-zinc-oxide (IGZO).

BACKGROUND

Liquid crystal displays (LCDs) generally display images by transmitting or blocking light through the action of liquid crystals. LCDs have been used in a variety of computing displays and devices, including notebook computers, desktop computers, tablet computing devices, mobile phones (including smart phones) automobile in-cabin displays, on appliances, as televisions, and so on. LCDs often use an active matrix to drive liquid crystals in a pixel region. In some LCDs, a thin-film transistor (TFT) is used as a switching element in the active matrix.

FIG. 1A illustrates a perspective view of a sample electronic device, such as a tablet computer. The electronic device includes a touch screen display 100 enclosed by a housing 138. The touch screen display 100A incorporates a cover glass 102 and an LCD 100B behind the cover glass 102, although alternative embodiments may employ an organic light-emitting display (OLED) layer instead of an LCD. The LCD 100B is not shown in FIG. 1A.

SUMMARY

Embodiments described herein may provide an oxide thin-film transistor (TFT) for a liquid crystal display (LCD). The TFT may include a semiconductor extension, such as an indium-gallium-zinc oxide (IGZO) extension. The semiconductor extension is configured to protect a gate insulator from loss during etching of the etch-stop (ES). Specifically, the semiconductor extension is configured such that a source electrode or a drain electrode does not contact the gate insulator in an overlapping area of the gate electrode and source electrode and in an overlapping area of the gate electrode and drain electrode. The IGZO is zinc oxide based and contains indium and gallium.

During processing, the IGZO extension covers the gate insulator in the overlapping areas between the gate electrode and the source electrode and also between the gate electrode and drain electrode, such that the IGZO extension protects the gate insulator during etching of the ES from loss. This absence of gate insulator loss may help reduce thickness variation in the gate insulator and thus capacitance variation between the gate and the source electrodes, and also capacitance variation between the gate and the drain electrodes. The disclosure also provides methods for fabricating the TFT with the semiconductor extension or IGZO extension.

In one embodiment, a method is provided for fabricating a thin-film transistor (TFT). The method includes forming a semiconductor layer over a gate insulator that covers a gate electrode, and depositing an insulator layer over the semiconductor layer, as well as etching the insulator layer to form a patterned etch-stop without losing the gate insulator. The method also includes forming a source electrode and a drain electrode over the semiconductor layer and the patterned etch-stop. The method further includes removing a portion of the semiconductor layer beyond the source electrode and the drain electrode such that a remaining portion of the semiconductor layer covers the gate insulator in a first overlapping area of the source electrode and the gate electrode and a second overlapping area of the drain electrode and gate electrode.

In another embodiment, a thin film transistor (TFT) is provided. The TFT includes a gate electrode disposed over a substrate, a gate insulator disposed over the gate electrode, and a semiconductor layer disposed over the gate insulator. The TFT also includes an insulator formed over the semiconductor layer. The TFT further includes a source electrode having a first portion covering a first portion of the insulator and a drain electrode having a first portion covering a second portion of the insulator. The semiconductor layer is configured to extend outwardly from the insulator layer and to cover the gate insulator to prevent from loss of the gate insulator during an etching of the insulator layer.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings, which forms a part of this disclosure.

BRIEF DESCRIPTION OF THE DRAWINGS

FIG. 4 shows a cross-sectional view of an ES deposition with gate insulator loss.

DETAILED DESCRIPTION

The present disclosure may be understood by reference to the following detailed description, taken in conjunction with the drawings as described below. It is noted that, for purposes of illustrative clarity, certain elements in various drawings may not be drawn to scale.

The present disclosure provides a TFT with a semiconductor extension or an IGZO extension for protecting the gate insulator (GI) from loss during etching. The reduction in gate insulator loss may help minimize capacitance variations in the TFT area. The TFT also includes an etch-stop layer which covers an entire aperture area to help improve optical uniformity.

Figure 1A:
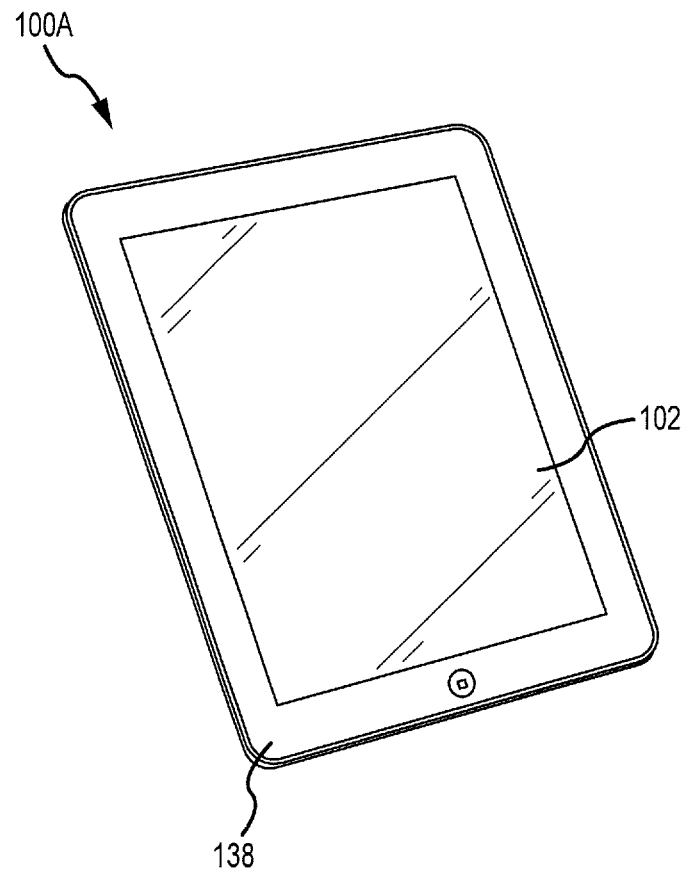
FIG. 1A illustrates a perspective view of a computing device.
Figure 1B:
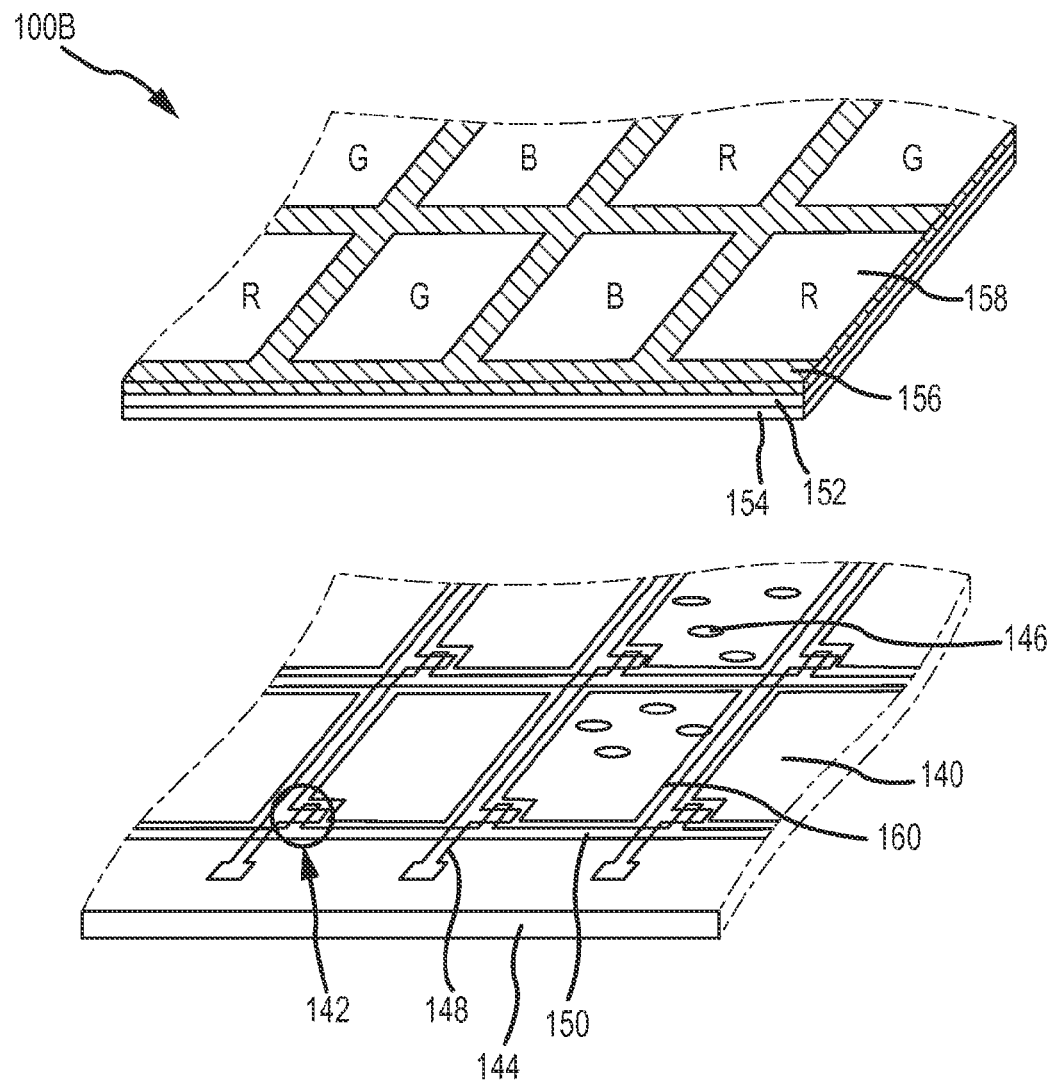
FIG. 1B shows an exploded perspective view of the liquid crystal display (prior art).

FIG. 1B shows an exploded perspective view of a sample liquid crystal display 100B (prior art), as may be used with the sample computing device of FIG. 1A. The liquid crystal display 100B may include a color filter substrate 152, an array substrate 144, and a liquid crystal layer 146 between the color substrate 152 and the array substrate 144, although some embodiments may omit or change the orders of one or more of these layers. A number of sub-color filters 158 may include red, green and blue colors, and may be arranged on the color filter substrate 152. A black matrix 156 may also be arranged on the color substrate 152 to divide the sub-color filters 158. Some embodiments may replace one or more of the red, green and blue filters with a yellow filter, a cyan filter, a clear filter, or another color filter. Further, the number of color filters and their arrangement may vary in certain embodiments.

There are a number of gate lines 150 and data lines 148 arranged horizontally and vertically to define a pixel region 140. The pixel region 140 may be generally rectangular in shape or square in shape. Still other embodiments may have differently-shaped pixel regions.

Returning to FIG. 1B, each pixel region 140 has a TFT area 142 located at its corner (as indicated by the circled region). The TFT area 142 switches a respective pixel for each pixel region 140 on and off. The pixel regions 140 are arranged on the array substrate 144, which may be formed of a glass. Each pixel region 140 also includes a liquid crystal layer 146. Typically, there is a unique pixel electrode 160 for each pixel region 140. A common electrode 154 may be attached to the color filter substrate 152. A voltage between the pixel electrode 160 and the common electrode 154 may be applied to the liquid crystal layer 146 for each pixel region 140. The voltage may control the alignment of liquid crystal molecules in the liquid crystal layer 146 and to control light transmission for each pixel of the LCD.

Figure 2:
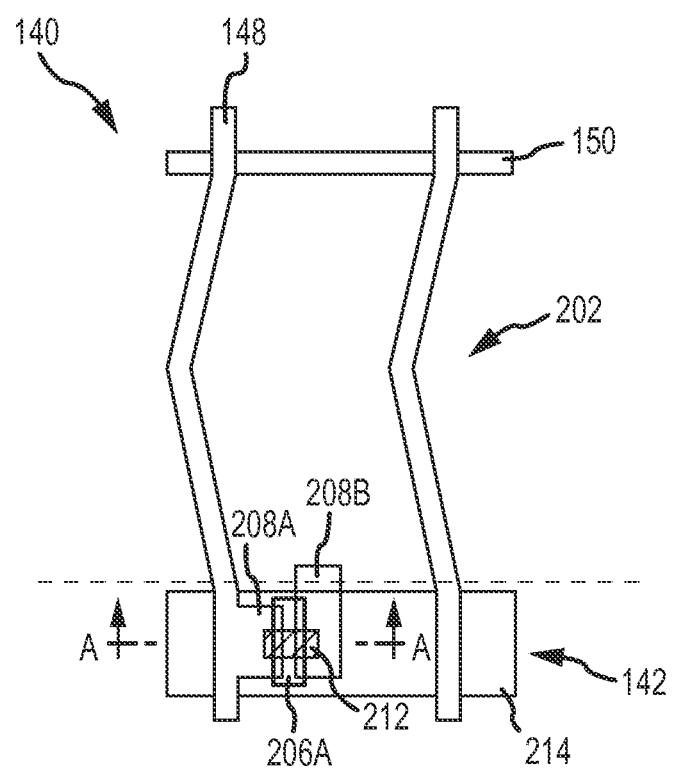
FIG. 2 shows a plan view of the pixel region of FIG. 1B, including a sample TFT.

FIG. 2 shows a plan view of a sample TFT. The pixel region 140 includes an active area (also referred to herein as an "aperture area") 202 above a dash-line and the TFT area 142 below the dash-line. In the active area 202, a gate insulator layer may be inadvertently thinned too much during manufacture, thus resulting in variations in thickness across the pixel or between pixels, which in turn may create an optical non-uniformity across the LCD. In the TFT area 142, this gate insulator loss may result in a variance in capacitance between the gate electrode 214 and the source electrode 208A, and/or a variance in capacitance between the gate electrode 214 and the drain electrode 208B.

The thickness of the gate insulator layer may vary during an etching process implemented to form an etch-stop 206A between the source 208A and drain 208B. The gate insulator loss may cover part or all of the entire active area or aperture area 202 and also a large portion of the TFT area 142, except the etch-stop 206A. The etch-stop 206A is in a rectangular shape oriented vertically, although it may have other shapes. The etch-stop 206A overlaps with a portion of a source electrode or region 208A and a drain electrode or region 208B. A semiconductor layer 212 is also shown in a rectangular shape oriented horizontally, which overlaps with a portion of the source region 208A and drain region 208B, as well as etch-stop 206A. The semiconductor layer 212 may be formed of indium-gallium-zinc-oxide (IGZO) or others and the like.

A data line 148A may be connected to source region or electrode 208A, as shown in FIG. 2. A gate line 150 may be connected to gate electrode or region 214. This connection is not shown in this view of FIG. 2. The data line 148A and gate line 150 may be connected to multiple TFTs as shown in FIG. 1B. Data line 148B is for a neighboring TFT.

Figure 3:
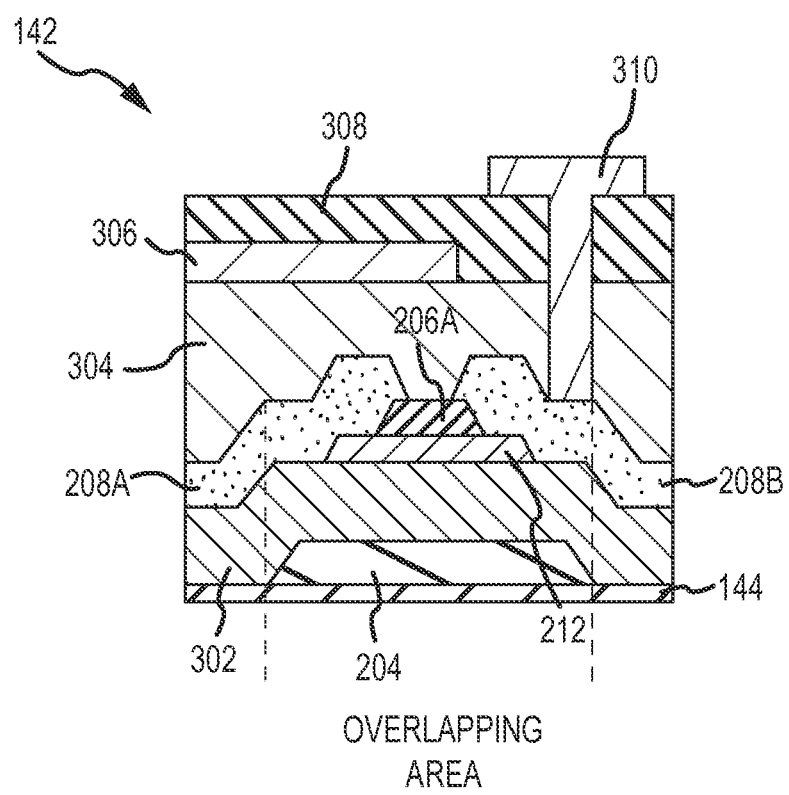
FIG. 3 shows an exploded cross-sectional view of the sample TFT of FIG. 2.

FIG. 3 shows an exploded cross-sectional view of a sample TFT, such as that depicted in FIG. 2. The TFT area 142 includes gate electrode 204 disposed over a substrate 144, a source electrode 208A and a drain electrode 208B. The TFT area 142 also includes a gate insulator 302 disposed over the gate electrode 204, a semiconductor layer, such as IGZO 212, over the gate insulator 302 and an etch-stop 206A over the IGZO 212. The etch-stop 206A is positioned to separate the source electrode 208A and the drain electrode 208B. The IGZO 212 extends beyond the etch-stop 206A sideway and connects to both the source electrode 208A and the drain electrode 208B. The TFT area 142 also includes a planarization layer 304 over the source electrode 208A and drain electrode 208B. The TFT area 142 further includes a common electrode 306 for all pixels. The common electrode 306 is disposed over the planarization layer 304. The TFT area 142 also includes a pixel electrode 310, and a passivation layer 308 that separates the common electrode 306 from the pixel electrode 310. The planarization layer 304 may be formed of an organic insulator, such as a photoactive compound (PAC) and may provide a flat surface for forming more layers, such as forming the common electrode 306 and the pixel electrode 310 among others. The pixel electrode 310 may be connected to the drain electrode 208B or source electrode 208A (not shown). The source and drain electrodes may be interchangeable.

FIG. 4 shows a cross-sectional view of an ES deposition for forming the etch-stop of FIG. 3 with gate insulator loss, as the arrows A-A in FIG. 2 illustrate where the cross-section is. The etching process for forming the etch-stop may result in a gate insulator loss. As shown, the gate electrode 204 may be formed on a portion of the substrate 144. The gate insulator 302 may cover the gate electrode 204. The semiconductor such as IGZO 212 may be deposited on the gate insulator 302 in the region above the gate electrode 204. An etch-stop (ES) layer 206 may be disposed over the IGZO 212. The ES stop layer 206 may be formed of an insulator, such as $SiO_2$, and the like. Then, a photoresist layer 314 is disposed over the ES layer 206 to cover a portion 206A of the etch-stop layer 206. A remaining portion 206B of the ES layer 206 is not covered by the photoresist 314 and so is exposed. The exposed ES portion 206B may be removed by etching. During the etching, the gate insulator 302 may be removed along with the etch-stop 206B, because it is difficult to distinguish the etch-stop 206B from the gate insulator 302 that is below the etch-stop 206B. This difficulty arises since the gate insulator 302 may be formed of similar materials to the ES 206. Thus, as one example, the gate insulator 302 may be etched away down to the dashed line 316, rather than leaving the entirety of the gate insulator intact (represented by line 318). The difference between the lines 316 and 318 is referred as "gate insulator loss."

Figure 5A:
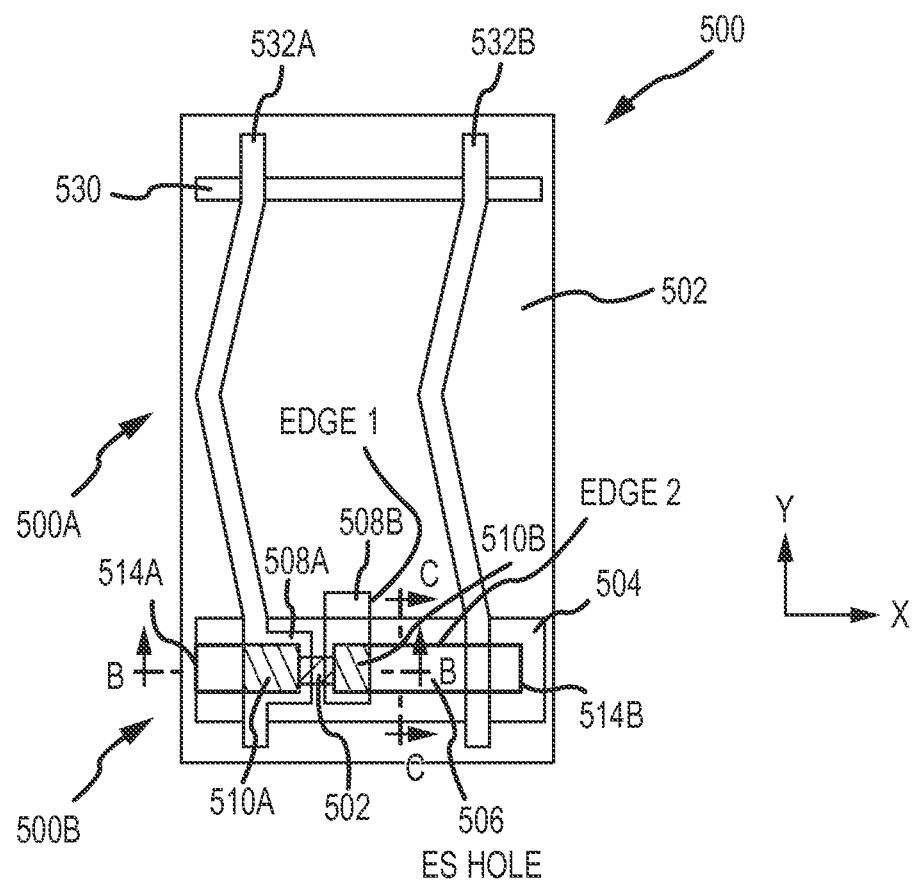
FIG. 5A illustrates a plan view of a pixel region with a TFT in an embodiment.

FIG. 5A illustrates a plan view of a pixel region with a TFT in accordance with a sample embodiment. An entire pixel region 500 includes a pixel area 500A above a dash-line and a TFT area 500B below the dash-line. The TFT area 500B includes an IGZO extension that prevents the gate insulator loss during an etching process for the etch-stop. An etch-stop (ES) layer 502 may cover the entire pixel region 500 except two etch-stop holes 506A-B, illustrated by lines contoured 514A and 514B, respectively. For example, the etch-stop layer 502 may be in a rectangular shape as shown. In addition, a gate electrode 504 may also be rectangular-shaped and may overlap with a source electrode 508A and a drain electrode 508B. The source and drain electrodes 508A and 508B may be separated by ES 502. The two ES holes 506A-B as contoured by lines 514A and 514B may overlap at least portions of the source electrode 508A and drain electrode 508B. A portion of the etch-stop layer 502 is positioned between the source electrode 508A and the drain electrode 508B. The etch-stop 502 may help improve optical uniformity in the pixel area or aperture area 500A, as the etch-stop may minimize gate insulator loss in the pixel area 500A. It will be appreciated by those skilled in the art that the source and drain electrodes 508A and 508B may be interchangeable.

A semiconductor layer may be placed under the ES layer 502. In a particular embodiment, the semiconductor layer may be an indium-gallium-zinc-oxide (IGZO). The IGZO has a relatively high mobility, such as 1-100 cm$^2$/Vs, compared to an amorphous silicon thin-film transistor. In addition, the IGZO may be optically transparent. The semiconductor layer, such as IGZO layer, overlaps with a larger portion of the source and drain electrodes 508A and 508B than the ES 502. Specifically, an IGZO extension 512 may be under the ES 502 between the source and drain electrodes 508A and 508B. A portion of the IGZO extension 512 positioned under the ES 502 may have the same or similar surface area as the ES 502. The IGZO extension 512 may also include a first overlapping area 510A between source 508A and gate 504, and a second overlapping area 510B between drain 508B and gate 504 (see FIG. 5A). The first and second overlapping areas 510A-B are on the two ends of the ES 502. Because the IGZO extension 512 covers the overlapping area 510A and 510B, there is little or no gate insulator loss in these areas.

The IGZO may be replaced by other semiconductor materials in some embodiments. It will be appreciated by those skilled in the art that the semiconductor layer may include or incorporate other materials, for example, zinc oxide (ZnO), indium oxide (InO), gallium oxide (GaO), tin oxide (SnO2), indium gallium oxide (IGO), indium zinc oxide (IZO), zinc tin oxide (ZTO), and indium zinc tin oxide (IZTO) among others.

As shown in FIG. 5A, a first data line 532A may be connected to source electrode 508A. A second data line 532B may be connected to a neighboring source electrode (not shown). A gate line 530 may be connected to gate electrode 504, although this connection is not shown in this view. This gate line 530 and first data line 532A may have similar functions to the vertical and horizontal gate lines 150 and data lines 148 shown in FIG. 1B.

Figure 5B:
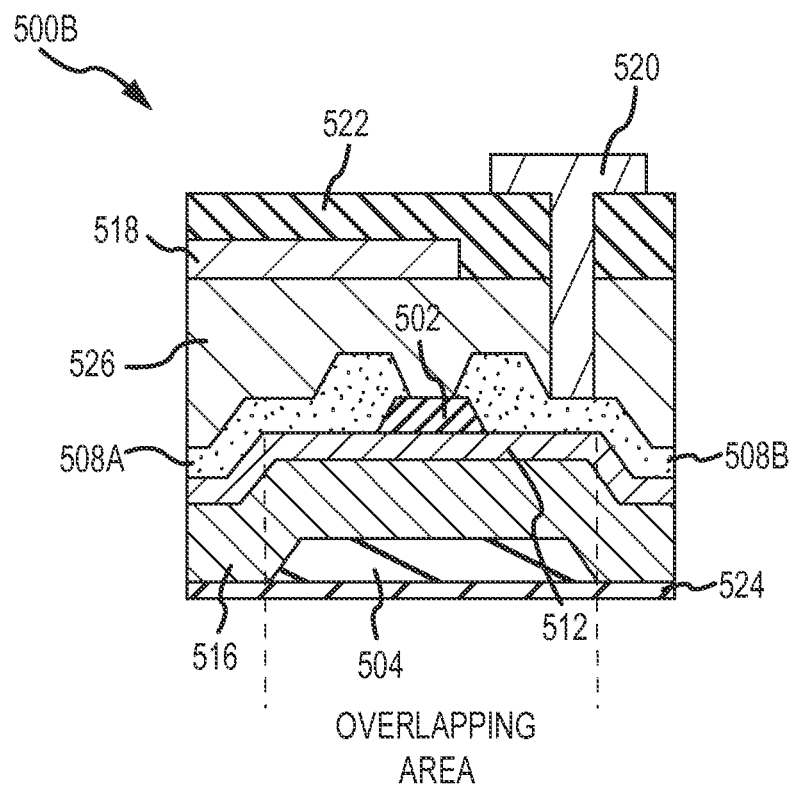
FIG. 5B illustrates a cross-sectional view of the TFT area of FIG. 5A.

FIG. 5B illustrates a cross-sectional view of the TFT area 500B of FIG. 5A as the arrows B-B shown in FIG. 5A illustrate where the cross-section is. The TFT area 500B includes a gate electrode 504, a source electrode 508A, and a drain electrode 508B. The TFT 500B also includes a planarization layer 526, a common electrode 518, a pixel electrode 520, and a passivation layer 522 that separates the common electrode 518 from the pixel electrode 520. The planarization layer 526 may be formed of an organic insulator, such as PAC Planarization layer 526 may be formed of an inorganic material, such as silicon nitride ($Si_3N_4$), and an organic material, such as acrylate, and/or an organic-inorganic hybrid like siloxane. The planarization layer may provide a flat surface for forming more layers, including the common electrode 518 and the pixel electrode 520. The PAC has relatively low dielectric constant, often considerably lower than the passivation layer 522. The pixel electrode 520 may be connected to the drain electrode 508B.

Referring to FIG. 5A again, the data line 532A and the gate line 530 may be controlled by a controller for an LCD (not shown) to change the "on" and "off" states of the TFT. Referring to FIG. 5B now, the pixel electrode 520 may be connected to the drain electrode 508B. A control signal is generated from the TFT, such that a voltage between the pixel electrode 520 and the common electrode 518 may be applied to the respective pixel.

The common electrode 518 and the pixel electrode 520 may be formed of a transparent conductive material, such as indium-tin oxide (ITO). The passivation layer 522 may be formed of a dielectric material. For example, SiNx may be used for forming the passivation layer 522, since SiNx has relatively high dielectric constant. Because of the high dielectric constant, SiNx, when used as a passivation layer 522, may provide a better capacitance match to the capacitor formed between the common electrode 518 and the pixel electrode 520.

As shown in FIG. 5B, the gate electrode 504 may be formed on the substrate 524. The substrate 524 may be transparent. The IGZO 512 may extend to cover the gate insulator 516 to protect the gate insulator 516 from loss during etching of the etch-stop layer to form the etch-stop 502. The source and drain layers 508A and 508B are separated from the gate insulator 516 in the overlapping area of the gate electrode with the source and drain electrodes (between two vertical dash-lines in FIG. 5B). This separation is different from the IGZO 206A arrangement as shown in FIG. 3A, where the IGZO 206A does not extend outwardly, and so the source and drain 208A-B contact the gate insulator 302 in the overlapping area of the gate with the source and the drain (between two vertical lines in FIG. 3). The gate electrode 504, source electrode 508A and the drain electrode 508B may be formed of a conductive material having low electrical resistance, such as copper or aluminum and the like.

Figure 6A:
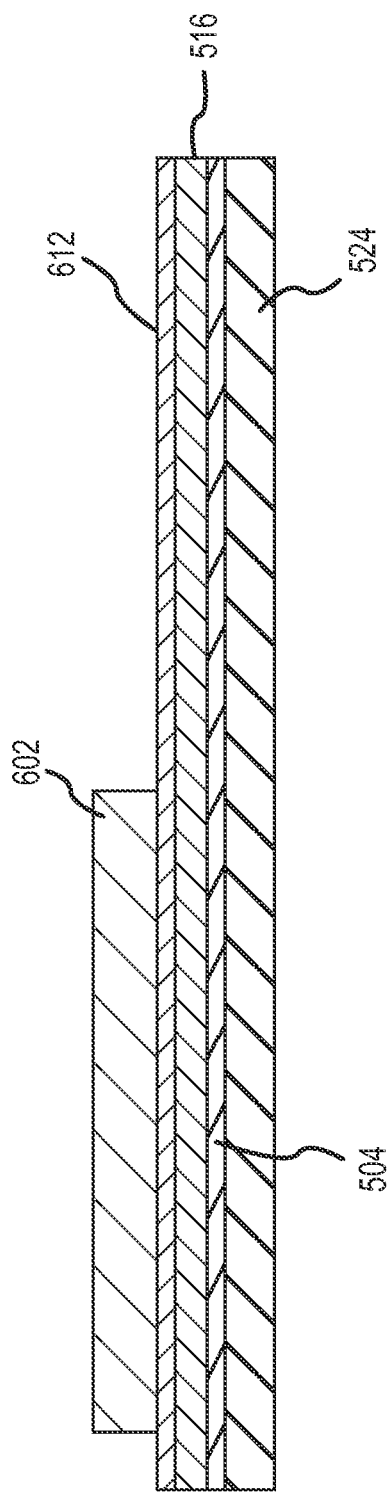
FIG. 6A shows a cross-sectional view of a gate deposition and an IGZO deposition in an embodiment.

FIGS. 6A-6B, and FIG. 6C-6G illustrate various cross-sectional views of different operations of a mask process that may form a TFT structure for a pixel of an LCD, in accordance with an embodiment. Initially, FIG. 6A illustrates a cross-sectional view of a gate deposition and an IGZO deposition in an embodiment. A first patterned photoresist for the gate electrode is not shown in FIG. 6A. A first mask is used to form the first patterned photoresist is also not shown in FIG. 6A for simplicity.

Generally, a photoresist film may be made of a photosensitive material; exposure to light (or particular wavelengths of light) to develop the photoresist. The developed photoresist may be insoluble or soluble to a developer. There may be two types of photoresist, a positive photoresist and a negative photoresist. The positive photoresist is soluble to the photoresist developer. The portion of the positive photoresist that is unexposed remains insoluble to the photoresist developer. The negative resist is a type of photoresist in which the portion of the photoresist that is exposed to light becomes insoluble to the photoresist developer. The unexposed portion of the photoresist is dissolved by the photoresist developer.

In embodiments disclosed below, a photoresist is first deposited on a surface, and then light is selectively passed through a patterned mask that may block light in certain areas. The exposed photoresist film is developed through the patterned mask to form the photoresist patterns as shown. The exposed photoresist film protects the layers underneath during an etching process, such that the portion exposed by the photoresist may be completely removed by the etching process, such as a wet etching. Portions of underlying layers that are protected by photoresist generally are not removed or otherwise etched. After etching to form a pattern of a deposited layer by using photoresist, the insoluble photoresist is removed prior to the next deposition operation. Different masks may be provided to form various films with different patterns. In alternative embodiments, different photoresist may be used.

Figure 6B:
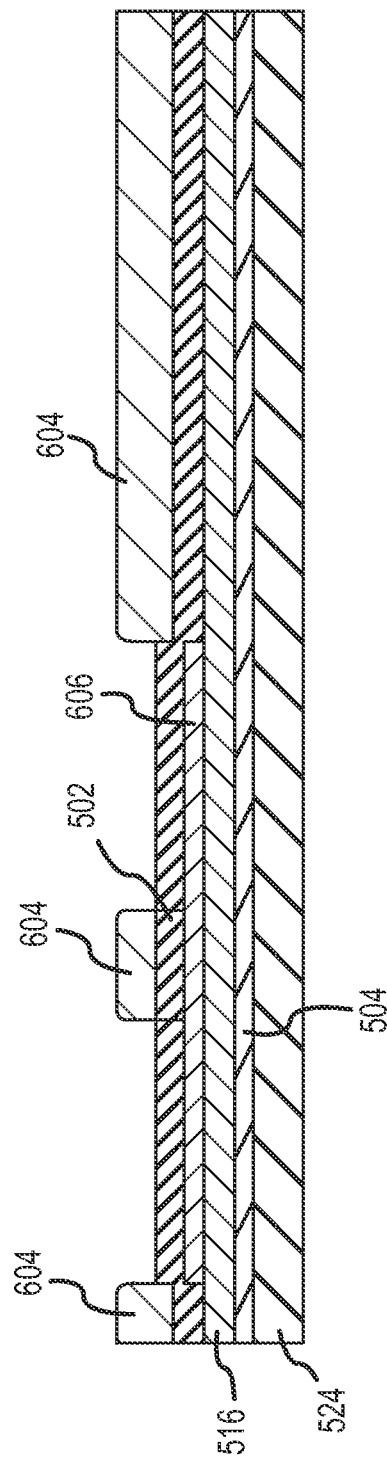
FIG. 6B shows a cross-sectional view of an ES deposition in an embodiment.

As shown in FIG. 6A, a second patterned photoresist 602 covers a portion of an IGZO layer 612. The IGZO layer 612 may be deposited over a gate insulator layer 516, which covers a gate electrode 504. The second patterned photoresist 602 is developed and protects the portion of the IGZO layer 612 underneath during etching to form an IGZO 606. The exposed portion or non-covered portion of the IGZO layer 612 will be removed by the etching. The remaining portion 606 of the IGZO layer 612 is shown in FIG. 6B. The second patterned photoresist 602 may be removed after the etching of the IGZO prior to the next deposition operation.

FIG. 6B shows a sample cross-sectional view of an ES deposition layer following the operation illustrated in FIG. 6A. FIG. 6B shows that a third patterned photoresist 604 may be placed on an etch-stop layer 502 which is deposited on top of the remaining portion 606 of the IGZO layer 612. The third patterned photoresist 604 is formed by a third mask (not shown) with a predetermined pattern. The third patterned photoresist 604 covers a portion of the etch-stop layer 502.

Next, an etching operation removes the exposed etch-stop layer 502 to form ES 610, which is a remaining portion of ES 502 under the third patterned photoresist 604. After the etching operation using the third patterned photoresist 604, the etching holes 514A-B are formed. During etching of the ES layer 502, the IGZO layer 606 protects the gate insulator 516 from loss.

Figure 6C:
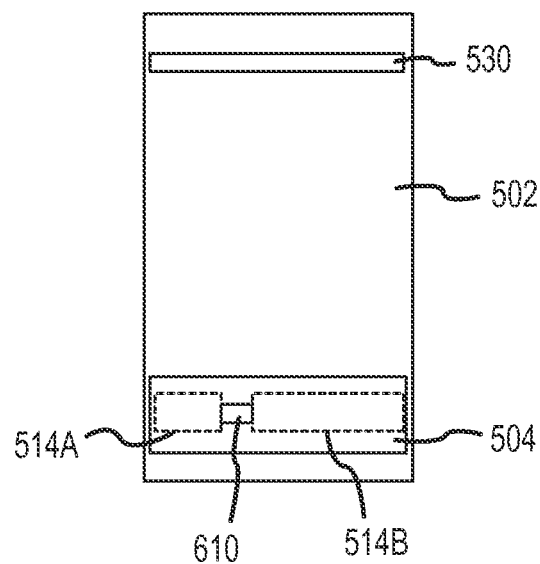
FIG. 6C illustrates a plan view of the pixel region after the operation illustrated in FIG. 6B.

FIG. 6C illustrates a simplified plan view of the pixel region after completing etching with the third patterned photoresist. As shown, an ES layer 502 covers the entire pixel region except two ES holes illustrated by contoured dashlines 514A and 514B. A semiconductor layer 606, such as IGZO layer, may fill the ES holes 514A-B to protect the gate insulator from loss during the etching of the ES. An ES portion 610 may be formed between the two ES holes 514A-B in the gate electrode 504. The semiconductor 606, such as IGZO layer, is also underneath the ES portion 610, which is shown more clearly in FIG. 6D below. A gate line 530 may be connected to the gate electrode 504 (not shown).

Figure 6D:
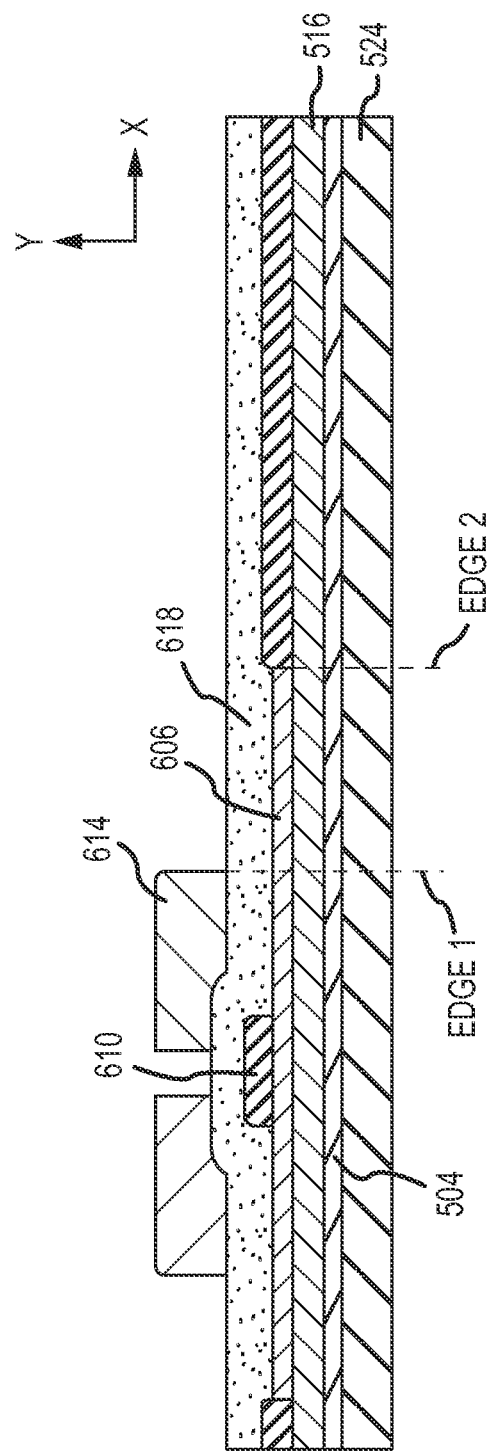
FIG. 6D shows a sample cross-sectional view of a source/drain deposition following the operation illustrated in FIG. 6B.

FIG. 6D shows a sample cross-sectional view of a source and drain deposition and a fourth mask to form a fourth patterned photoresist following the operation as illustrated in FIG. 6B. As shown in FIG. 6D, a source/drain layer 618 may be disposed over the ES 610 and an exposed portion of the remaining IGZO layer 606, or a portion is not covered by the ES 610. A fourth patterned photoresist 614 covers a portion of the source and drain layer 618. The exposed portions of the source and drain layer 618 (e.g., the portions not covered by the fourth patterned photoresist 614) are etched away to form source 618A and drain 618B. Likewise, the etching operation also removes the exposed portion of the IGZO 606 to form IGZO section 616, which is a remaining portion under the photoresist 614.

Figure 6E:
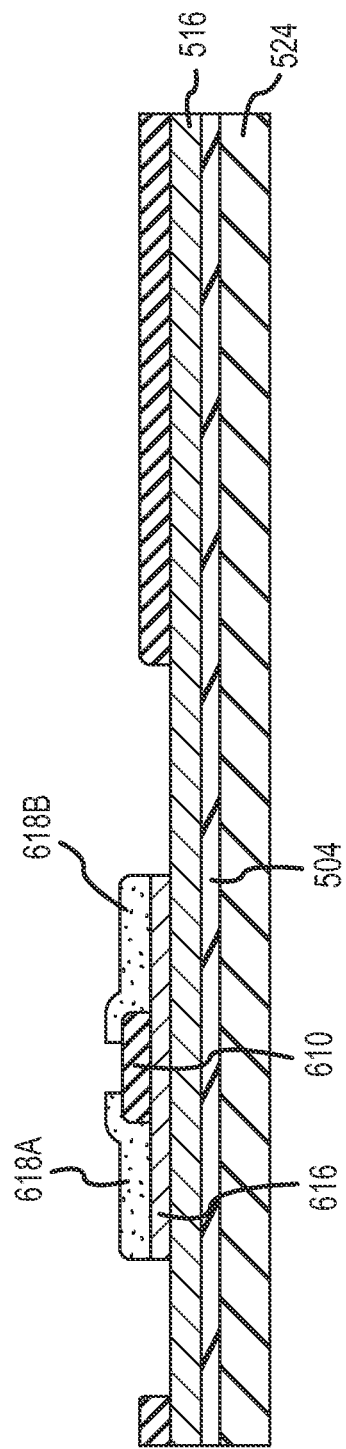
FIG. 6E shows a sample cross-sectional view of the TFT after completing the etching operation by the fourth patterned photoresist of FIG. 6D.

FIG. 6E shows a cross-sectional view of the TFT after another etching operation. Note that the source and drain 618A and 618B are formed partially on top of the etch-stop 610 and partially on top of a patterned IGZO layer 616. The vertical edges of the source and drain 618A-Bare substantially aligned with the vertical edges of the semiconductor layer 616. Referring to FIG. 5A again, the remaining IGZO portion 616 includes IGZO 510A and IGZO 510B in the ES holes after the etching operation with the fourth patterned photoresist 614. The remaining portion 616 also includes an IGZO portion located under the ES 502 and is similar to IGZO 512 (see FIG. 5B).

Referring to FIG. 6D again, edge 1 is defined by the fourth patterned photoresist 614 while edge 2 is defined by the ES 610. Even though edge 1 looks apparently parallel to edge 2 as shown in FIG. 6D, edge 1 is actually substantially perpendicular to the edge 2 as shown in FIG. 5A. Referring to FIG. 5A again, edge 1 is substantially parallel to a Y-axis and edge 2 is substantially parallel to an X-axis which is perpendicular to the Y-axis. This is because the layout to the right side of the edge 2 in FIG. 6D is actually rotated by about 90 degrees from the layout to the left side of the edge 2. This rotation permits depiction of the ES 610 and other layers to the right side of edge 2 in the same view as the layout to the left side of the edge 2. Thus, to the right side of edge 2, the cross-section is taken along line C-C shown in FIG. 5A.

Figure 6F:
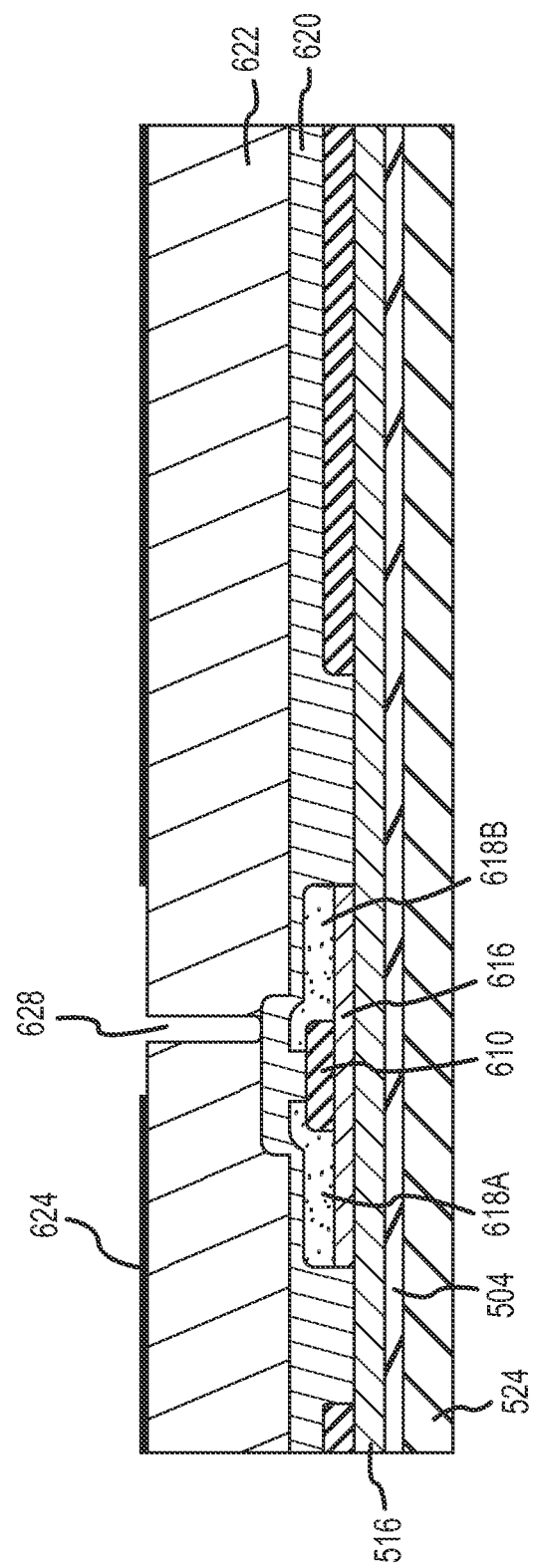
FIG. 6F shows a sample cross-sectional view of a first passivation deposition, an organic insulator deposition, and a common electrode deposition following the operation illustrated in FIG. 6D.

FIG. 6F shows a sample cross-sectional view of a first passivation deposition, an organic insulator deposition, and a common electrode deposition following the operation illustrated in FIG. 6D. As shown, a first passivation layer 620 may be disposed over the source and drain regions 618A-B and the ES 610. Then, an organic insulator 622 may be disposed over the first passivation layer 620. A fifth mask (not shown) may be used to form a via hole 628 above the first passivation layer 620 by etching or lithography to remove the material in the via hole 628. A common electrode layer 624 may be deposited over the organic insulator 622. A sixth mask (not shown) may be used to form the patterned common electrode 624 by etching to remove a portion of the electrode layer as predetermined by the mask. This common electrode 624 has a similar function to the common electrode 154 shown in FIG. 1B.

Figure 6G:
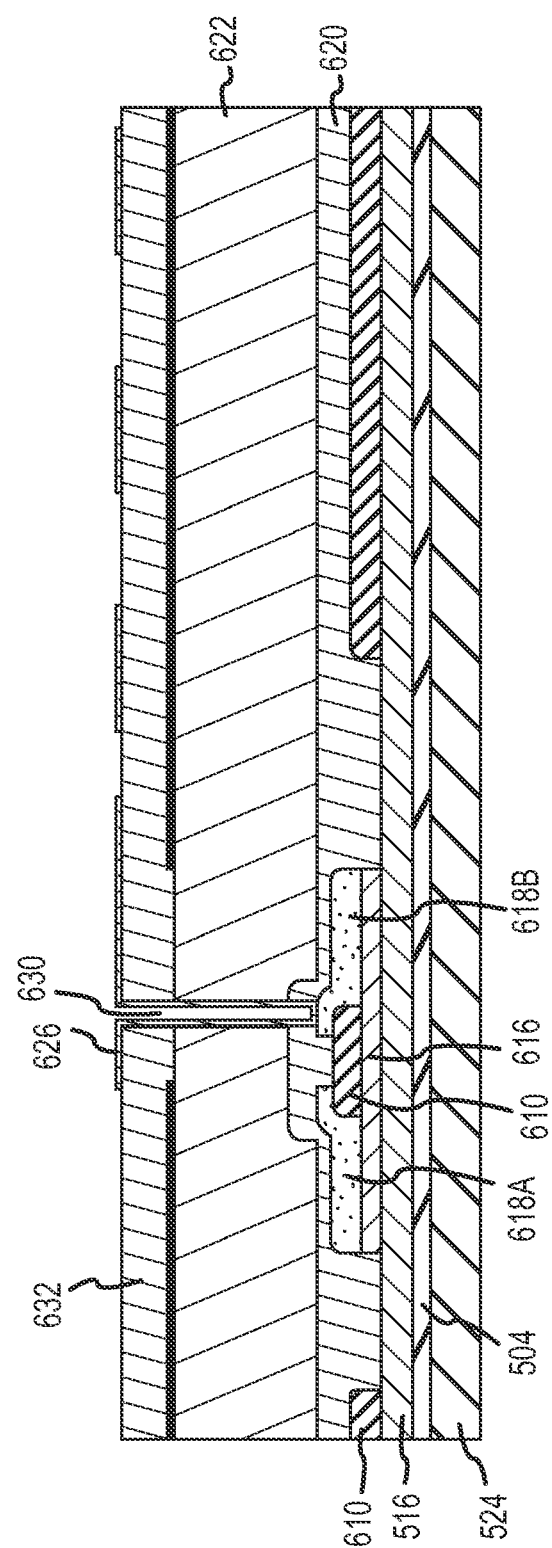
FIG. 6G shows a sample cross-sectional view of a second passivation deposition and a pixel electrode deposition following the operation illustrated in FIG. 6F.

FIG. 6G shows an example cross-sectional view of a second passivation deposition and a pixel electrode deposition following the operation illustrated in FIG. 6F. A second passivation layer 632 may be disposed over the common electrode 624 and the organic insulator 622. A seventh mask (not shown) may be used to form a via hole 630 through the second passivation layer 632, similar to forming the via hole 628. A pixel electrode layer is then deposited over the second passivation layer and the via hole 630. An eighth mask (not shown) may be used to form a patterned pixel electrode 626, similar to forming the common electrode 624. This pixel electrode 626 has similar function to the pixel electrode 160 as shown in FIG. 1B. The first passivation layer 620 may be formed of an insulator such as silicon oxide (SiO2), among others. The second passivation layer 632 may also be formed of an insulator, such silicon nitride (SiNx) among others. The common electrode 624 and the pixel electrode 626 may be formed of a transparent conductor, such as indium-tin oxide (ITO), indium zinc oxide (IZO) and others. The organic insulator may include photo inactive or photo active polymer. Furthermore, the photoactive compound (PAC) may be positive tone or negative tone material. The polymer bases may be acrylate, cyclic olefine polymer, and/or siloxane, among others. The IGZO 616 has a relatively high mobility and is optically transparent. The IGZO 616 may also be formed by a reactive sputtering method or a pulsed laser deposition (PLD) method, and the like. The gate insulator 516 may be formed of an inorganic insulator film including silicon oxide ($SiO_2$), silicon nitride ($SiN_x$), a dielectric oxide film such as aluminum oxide ($Al_2O_3$), or an organic material, and the like. The gate insulator 516 may be formed by a chemical vapor deposition (CVD) method using a plasma enhanced chemical vapor deposition system or formed by a physical vapor method using a sputtering system. Other deposition processes may also or alternatively be used.

The gate insulator 516 may include multiple layers of the above materials. For example, the gate insulator 516 may include one or more insulation layers. In a particular embodiment, the gate insulator 516 may have a two-layer structure. A silicon nitride layer may be formed as a first insulating layer and a silicon oxide layer may be formed as a second insulating layer. This gate insulator 516 may prevent an impurity such as moisture or alkali metal or copper contamination from diffusing into a TFT element and a display device and may also improve reliability of a semiconductor element formed in an element formation layer, or the like.

The TFT with a semiconductor extension or an IGZO extension may be used for a conventional liquid crystal display, any other liquid crystal displays which may vary in color filter/liquid crystal layout or configuration, or organic light-emitting display (OLED). The TFT may be used for a touch screen display that includes a touch panel with the liquid crystal display.

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A thin film transistor (TFT), the TFT comprising:
a gate electrode disposed over a substrate;
a gate insulator disposed over the gate electrode;
a semiconductor layer disposed over the gate insulator so as to cover the gate insulator entirely, wherein the semiconductor layer is formed of indium-gallium-zinc-oxide;
an insulator formed over the semiconductor layer;
a source electrode having a first portion covering a first portion of the insulator; and
a drain electrode having a first portion covering a second portion of the insulator,
wherein the semiconductor layer is configured to extend outwardly from the insulator and to cover a region between the insulator and the gate insulator to prevent loss of the gate insulator during an etching of the insulator.

2. The TFT of claim 1, wherein the gate insulator comprises one or more layers of one or more dielectric materials, each material being selected from a group consisting of silicon oxide ($SiO_2$), silicon nitride ($SiN_x$), aluminum oxide ($Al_2O_3$), and organic material.

3. The TFT of claim 1, wherein each of the gate electrode, the source electrode, and the drain electrode comprises one or more layers of a conductive material selected from a group consisting of copper, copper alloy, aluminum, aluminum alloy, titanium, and molybdenum.

4. The TFT of claim 1, wherein the substrate comprises a glass.

5. The TFT of claim 1, wherein the insulator comprises silicon oxide or aluminum oxide.

6. The TFT of claim 1, wherein the semiconductor layer covers the gate insulator in a first overlapping area between the drain electrode and the gate electrode and a second overlapping area between the source electrode and the gate electrode.

7. The TFT of claim 1, wherein the semiconductor layer contacts a second portion of the drain electrode and a second portion of the source electrode, the second portions of the drain electrode and the source electrode being outside the region of the insulator.

8. The TFT of claim 1, wherein the first portion of the drain electrode and the first portion of the source electrode are separated by a third portion of the insulator, the third portion being between the first portion and the second portion of the insulator.

9. The TFT of claim 1, wherein the semiconductor layer is configured to overlap with a larger portion of the drain electrode and the source electrode than the insulator.

10. The TFT of claim 1, wherein the insulator comprises silicon oxide.

11. The TFT of claim 1, wherein the drain electrode is configured to separate from the source electrode by the insulator.

* * * * *